US007345401B2

(12) United States Patent
Schief

(10) Patent No.: US 7,345,401 B2
(45) Date of Patent: Mar. 18, 2008

(54) METHOD AND CIRCUIT ARRANGEMENT FOR OPERATING AN ULTRASOUND OSCILLATOR

(75) Inventor: Dieter Schief, Muggensturm (DE)

(73) Assignee: Martin Walter Ultraschalltechnik AG, Straubenhardt (DE)

( * ) Notice: Subject to any disclaimer, the term of this patent is extended or adjusted under 35 U.S.C. 154(b) by 0 days.

(21) Appl. No.: 11/478,454

(22) Filed: Jun. 29, 2006

(65) Prior Publication Data

US 2007/0001548 A1 Jan. 4, 2007

(30) Foreign Application Priority Data

Jul. 1, 2005 (DE) ...................... 10 2005 030 777

(51) Int. Cl.
*H01L 41/09* (2006.01)

(52) U.S. Cl. ...................................................... 310/317

(58) Field of Classification Search ........... 310/316.01, 310/317

See application file for complete search history.

(56) References Cited

U.S. PATENT DOCUMENTS 4,371,816 A * 2/1983 Wieser ....................... 318/118
4,879,528 A * 11/1989 Gotanda ........................ 331/4
4,901,034 A * 2/1990 Frank-Peter ................... 331/4
4,965,532 A * 10/1990 Sakurai ......................... 331/4
5,425,704 A * 6/1995 Sakurai et al. ................ 604/22
5,986,385 A * 11/1999 Atsuta ................... 310/323.06
2002/0036444 A1* 3/2002 Yamashiro et al. .... 310/316.01

FOREIGN PATENT DOCUMENTS

JP 2-099050 * 4/1990
JP 07-303635 * 11/1995

* cited by examiner

*Primary Examiner*—Thomas M. Dougherty
(74) *Attorney, Agent, or Firm*—Klaus J. Bach

(57) ABSTRACT

In a method and a circuit arrangement for operating an ultrasound oscillator with a constant oscillation amplitude wherein an excitation voltage U, whose frequency is disposed outside the resonance frequency of an ultrasound oscillation system, is applied to the ultrasound oscillator which includes components forming therewith an oscillation circuit for generating an excitation current I, whose size is adjusted by changing the frequency of the excitation voltage U to a predetermined value, the level of the excitation voltage U is detected by a voltage sensor and the predetermined value of the size of the excitation current I is set depending on the level of the excitation voltage U.

7 Claims, 1 Drawing Sheet

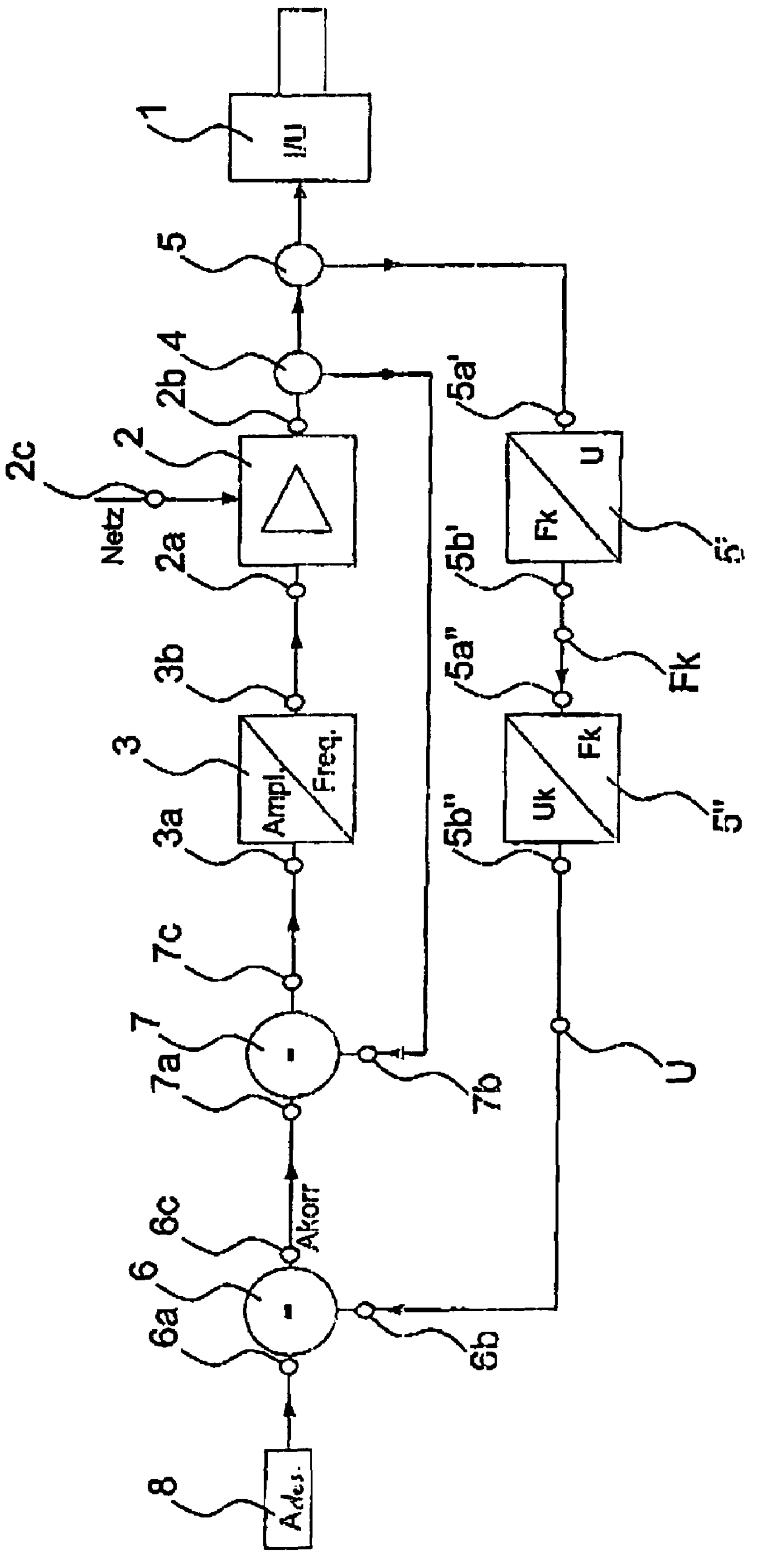
1
I/U
5
4
2b
2
2c
Netz
2a
3b
3
Ampl.
Freq.
3a
7c
7
7a
7b
6c
Akorr
6
6a
6b
8
Ades.
5a'
U
Fk
5'
5b'
Fk
5a"
Uk
Fk
5"
5b"
U

METHOD AND CIRCUIT ARRANGEMENT FOR OPERATING AN ULTRASOUND OSCILLATOR

BACKGROUND OF THE INVENTION

The invention resides in a method for operating an ultrasound oscillator with a constant oscillation amplitude, including an ultrasound oscillation system which comprises an ultrasound oscillator and components forming therewith an oscillation circuit and to which an excitation voltage is applied to generate an excitation current, wherein the excitation voltage has a frequency outside a resonance frequency of the oscillation system and the size of the excitation current is adjustable by changing the frequency of the excitation voltage.

Furthermore, the invention resides in a circuit arrangement for operating an ultrasound oscillator in accordance with the method described above, including an amplifier with an input and an output which provides the excitation voltage and the excitation current for the ultrasound oscillator system and an oscillator whose frequency is adjustable at a control input and whose output is connected to the input of the amplifier and, furthermore, a current sensor for determining the excitation current.

Such a method and such a circuit arrangement are known in the state of the art and are used for example in the ultrasound welding apparatus manufactured and sold by the assignee of the present application.

For ultrasound welding apparatus, it is important that the energy input into a respective workpiece is constant. It is therefore necessary that the oscillation amplitude of the ultrasound oscillator is constant since the energy input into a respective workpiece depends on the oscillation amplitude of the welding head. This means that the energy input into a workpiece depends on the oscillation amplitude of the ultrasound oscillator. Since the oscillation amplitude of the ultrasound oscillator depends on the excitation current of the ultrasound oscillation system including the ultrasound oscillator and the components forming together therewith an oscillation circuit, the oscillation amplitude of the ultrasound oscillator is maintained constant by keeping the excitation current of the ultrasound oscillation system constant.

In order to facilitate the control of the excitation current, the ultrasound oscillation system is not operated at its series resonance but generally with a frequency which is between the series resonance and the parallel resonance of the ultrasound oscillation system. Since, by changing the frequency at which the ultrasound oscillation system is operated, the impedance of the ultrasound oscillator can be changed, the current flow through the ultrasound oscillation system can be changed by changing the operating frequency of the ultrasound oscillation system.

If during the operation of the ultrasound oscillation system the current flow through the ultrasound oscillation system is changed, for example as a result of outer influences, the frequency of the excitation voltage applied to the ultrasound oscillation system is changed until the excitation current of the ultrasound oscillation system has again reached the previous value.

It has been found however that, in spite of a high quality control of the excitation current to a constant value, the oscillation amplitude of the ultrasound oscillator will deviate.

It is the object of the present invention to provide a method for operating an ultrasound oscillator and respectively, a circuit arrangement by which the constancy of the oscillation amplitude of the ultrasound oscillator is improved.

SUMMARY OF THE INVENTION

In a method for operating an ultrasound oscillator with a constant oscillation amplitude, wherein an excitation current is applied to an ultrasound oscillation system which comprises an ultrasound oscillator and components forming therewith an oscillation circuit for generating an excitation current whose frequency is outside a resonance frequency of the ultrasound oscillation system, and wherein the size of the excitation current is adjustable by changing the frequency of the excitation voltage to a predetermined value, the level of the excitation voltage is detected and the predetermined value of the size of the excitation current is determined depending on the detected level of the excitation voltage.

Furthermore, in a circuit arrangement for operating an ultrasound oscillator according to the above method, including an amplifier with an input and an output which provides the excitation voltage and the excitation current for the ultrasound oscillation system, and an oscillator whose frequency is adjustable at a control input thereof and whose output is connected to the input of the amplifier, and a current sensor for detecting the excitation current, a voltage sensor for detecting the excitation voltage is provided.

Since the level of the excitation voltage can be detected, the predetermined value, to which the excitation current should be adjusted, can be determined depending on the level of the excitation voltage. As a result, the excitation current can be corrected depending on a change of the excitation voltage.

In this way, because of a change of the excitation current resulting for example from power supply voltage variations, the excitation current can be adjusted depending on the changed excitation voltage level such that the oscillation amplitude of the ultrasound oscillator has the same value which it had with the previous values of the excitation voltage and excitation current. It can therefore be taken into account that the oscillation amplitude of the ultrasound oscillator depends on the frequency of the excitation current as it has been found that the oscillation amplitude of the ultrasound oscillator changes with a change of the operating frequency although the excitation current is kept constant.

With the dependency of the desired value of the excitation current on the value of the excitation voltage these deviations can also be corrected if the excitation current is controlled to a constant value. Advantageously, the excitation current can be kept constant by changing the frequency to a predetermined value. This means that, with the method according to the invention, the excitation current can be controlled by changing the frequency.

In one possible way of performing the method according to the invention, the deviation of the excitation voltage from its desired value is detected and the change of the operating frequency necessary to generate the excitation current needed for the ultrasound oscillation system which was present before the change of the excitation voltage is determined from a table which was empirically obtained (performance graph). From another performance graph the value of the excitation current can then be derived which is needed to provide an oscillation amplitude for the ultrasound oscillator with the changed operating frequency which has the same value as it had before the change of the excitation voltage or, respectively, before the change of the original operating frequency. The new value of the excitation current obtained in this way may then serve as the desired value to which the excitation current is controlled with the changed excitation current.

Of course, the new desired value for the excitation current may also be determined by a calculation algorithm. It must however be taken into consideration that the calculation algorithm must always be adapted to the particular ultrasound oscillator present in the circuit.

Below, exemplary embodiments of the invention will be explained on the basis of the accompanying drawings.

BRIEF DESCRIPTION OF THE DRAWINGS

The sole FIGURE is a schematic representation of a circuit arrangement according to the invention.

DESCRIPTION OF AN EXEMPLARY EMBODIMENT

As apparent from the FIGURE, an ultrasound oscillation system 1, which comprises an ultrasound oscillator and components forming therewith an oscillation circuit and which is part of an ultrasound welding apparatus, is connected to the output 2*b* of an amplifier 2. For receiving power, the amplifier 2 includes a power supply input 2*c* via which the amplifier 2 is connected to an electric power network. The input 2*a* of the amplifier 2 is connected to the output 3*b* of an oscillator 3. The frequency of the oscillator 3 can be adjusted via a control input 3*a*. The adjustable frequency range extends from about 15 kilohertz to 70 kilohertz.

The control input 3*a* of the oscillator 3 is connected to the output 7*c* of a second comparison element 7, which has a first input 7*a* and a second input 7*b*. The second input 7*b* of the second comparison element 7 is connected to the output of a current sensor 4 which detects the output current 1 of the amplifier 2 and, consequently, the excitation current 1 of the ultrasound oscillation system. The first input 7*a* of the second comparison element 7 is connected to the output 6*c* of a first comparison element 6, which has a first input 6*a* and a second input 6*b*.

The second input 6*b* of the comparison element 6 is connected to the output 5*b*" of a second signal former 5" in the form of a storage device 5". The input 5*a*" of the second signal former 5" is connected to the output 5' of a first signal former 5' in the form of a storage device. The input 5*a*" of the first signal former 5' is connected to the output of a voltage sensor 5 which detects the output voltage U of the amplifier 2 and consequently the excitation voltage U of the ultrasound oscillation system 1.

The first input 6*a* of the first comparison element 6 is connected to a desired value transmitter 8. The desired value transmitter 8 provides a signal for setting the desired value for the frequency of the oscillator 3.

If the excitation voltage U of the ultrasound oscillation system 1 is lowered for example by changes in the power supply network, the excitation current 1 of the ultrasound oscillation system 1 is lowered. This results in a reduction of the output voltage of the second comparison element 7 and, as a result, in a reduction of the frequency of the oscillator 3. Since, with a reduced frequency, the ultrasound oscillator system 1 has a reduced impedance, the excitation current 1 of the ultrasound oscillation system 1 again increases. The excitation current of the ultrasound oscillation system increases until it reaches its previous value—except for a control deviation.

However, at the same time, the voltage sensor 5 detects the reduced excitation voltage and supplies this value to the input 5*a*' of the first signal former 5'. Depending on this value, the first signal former 5' provides at its output 5*b*' a signal FK which corresponds to the value by which the frequency of the oscillator 3 would have to be reduced in order for the excitation current to reach its previous value. The value of the output signal FK corresponds essentially to the frequency change described above. But it is free from influences which could occur as the result of other disturbance variables and cause an additional frequency change.

The output signal FK of the first signal former 5' is supplied to the input 5*a*" of the second signal former 5", in which correction values are stored by which the additional dependency of the oscillation amplitude of the ultrasound oscillator 1 on the frequency can be compensated for. That is, the second signal former 5" provides at its output 5*b*" a signal whose size corresponds to the value by which the excitation current I must be changed in order for the oscillation amplitude of the ultrasound oscillators 1 to obtain with the new operating frequency the same value as with the previous frequency, that is the frequency which the excitation voltage had before its change. By this value, the output signal of the desired value transmitter 8 is changed in the comparison element 6, whereby the submitted current control obtains a new desired value. As a result, with the changed excitation voltage an excitation current is established which generates in the ultrasound oscillator 1 the same oscillation amplitude, as it was present before the change of the excitation voltage U.

What is claimed is:

1. A method for operating an ultrasound oscillator (1) with a constant oscillation amplitude of an ultrasound oscillation system (1) including an ultrasound oscillator and components forming therewith an oscillation circuit for generating an excitation current (I), said method comprising the steps of: applying an excitation voltage (U) whose frequency is disposed outside a resonance frequency of the ultrasound oscillation system to the ultrasound oscillation system (1), adjusting the size of the excitation current (I) to a predetermined value by changing the frequency of the excitation voltage (U), detecting the level of the excitation voltage (U) and setting the predetermined value of the size of the excitation current (I) depending on the level of the excitation voltage (U).

2. A method according to claim 1, wherein the size of the excitation current (I) is maintained constant at the predetermined value by changing the frequency.

3. A circuit arrangement for operating an ultrasound oscillation system (1) comprising an amplifier (2) with an input (2*a*) and an output (2*b*) which output (2*b*) provides the excitation voltage and the excitation current for the ultrasound oscillation system (1), and an oscillator (3) having a frequency which is adjustable at a control input (3*a*) thereof and whose output (3*b*) is connected to the input (2*a*) of the amplifier (2), a current sensor (4) connected to the output (2*b*) of the amplifier (2) for detecting the excitation current (1), a voltage sensor (5) connected at the output (2*b*) of the amplifier (2) for determining the excitation voltage (U) and a correction arrangement (5', 5", 6) for the adjustment of the excitation current (I) depending on the level of the excitation voltage (U).

4. A circuit arrangement according to claim 3, including a first comparison element (6) having a first input (6*a*) which is connected to a desired value transmitter (8) and a second input (6*b*) which is connected to the voltage sensor (5) as well as an output (6*c*), which is connected to the control input (3*a*) of the oscillator (3).

5. A circuit arrangement according to claim 4, wherein a first signal former (5') is provided by which a first correction value (FK) can be formed from the output signal of the voltage sensor (5).

6. A circuit arrangement according to claim 5, wherein a second signal former (5") is provided by which a second correction value (UK) can be formed from the first correction value (FK).

7. A circuit arrangement according to claim 4, wherein a second comparison element (7) is provided including a first input (7*a*), which is connected to the output (6*c*) of the first comparison element (6), and a second input (7*b*), which is connected to the current sensor (4), as well as an output (7*c*) which is connected to the control input (3*a*) of the oscillator (3).

* * * * *